US009835884B2

(12) United States Patent
Zheng et al.

(10) Patent No.: US 9,835,884 B2
(45) Date of Patent: Dec. 5, 2017

(54) ARRAY SUBSTRATE AND METHOD FOR MANUFACTURING THE SAME, A DISPLAY PANEL AND METHOD FOR TESTING THE SAME, AND A DISPLAY APPARATUS

(71) Applicants: Boe Technology Group Co., Ltd., Beijing (CN); Beijing Boe Display Technology Co., Ltd., Beijing (CN)

(72) Inventors: Yaoxie Zheng, Beijing (CN); Zheng Bian, Beijing (CN); Jinwei Zhu, Beijing (CN)

(73) Assignees: Boe Technology Group Co., Ltd., Beijing (CN); Beijing Boe Display Technology Co., Ltd., Beijing (CN)

( * ) Notice: Subject to any disclaimer, the term of this patent is extended or adjusted under 35 U.S.C. 154(b) by 58 days.

(21) Appl. No.: 14/744,459

(22) Filed: Jun. 19, 2015

(65) Prior Publication Data

US 2016/0274387 A1    Sep. 22, 2016

(30) Foreign Application Priority Data

Mar. 17, 2015    (CN) .......................... 2015 1 0116854

(51) Int. Cl.
*G01R 31/26* (2014.01)
*G02F 1/13* (2006.01)
(Continued)

(52) U.S. Cl.
CPC ........ *G02F 1/1309* (2013.01); *G02F 1/13458* (2013.01); *H01L 22/32* (2013.01);
(Continued)

(58) Field of Classification Search
CPC .... G01R 31/3025; G01R 1/206; G01N 23/04; G01N 21/763; H01L 51/0005; H01L 27/12; A61N 1/36082
(Continued)

(56) References Cited

U.S. PATENT DOCUMENTS

2009/0212808 A1* 8/2009 Yoshii ................... G02F 1/1303
324/760.01
2011/0287561 A1    11/2011 Kang et al.

FOREIGN PATENT DOCUMENTS

CN            102331633         1/2012

OTHER PUBLICATIONS

Office Action from China Application No. 201510116854.0 dated Mar. 1, 2017.
(Continued)

*Primary Examiner* — Melissa Koval
*Assistant Examiner* — Trung Nguyen
(74) *Attorney, Agent, or Firm* — Calfee, Halter & Griswold LLP

(57) ABSTRACT

There are provided an array substrate and method for manufacturing the same, a display panel and method for testing the same, and a display apparatus. The array substrate comprises a display region and at least one bond region located outside of the display region; wherein a plurality of signal lines are disposed within the display region, and a plurality of wiring terminals connected to multiple ones of the plurality of signal lines through a plurality of first lead wires are disposed within each bond region; the array substrate further comprises one or more test regions corresponding to arbitrary one or more of the at least one bond region; wherein a plurality of test terminals are disposed within each test region, and the plurality of test terminals within any one of the one or more test regions are connected with the plurality of wiring terminals within a respective one of the at least one bond region through a plurality of second lead wires. The present invention implements a lead wire open test for a display panel for which the lead wire open test cannot be implemented in a traditional test mode.

11 Claims, 4 Drawing Sheets

(51) Int. Cl.
  *H01L 27/12* (2006.01)
  *H01L 21/66* (2006.01)
  *G02F 1/1345* (2006.01)

(52) U.S. Cl.
  CPC ........ *H01L 27/124* (2013.01); *H01L 27/1259* (2013.01); *G02F 1/13452* (2013.01)

(58) Field of Classification Search
  USPC ..... 324/760.01, 500, 762.01, 600, 602, 727, 324/750.15, 750.3; 257/59, 72, E33; 438/149
  See application file for complete search history.

(56) References Cited

OTHER PUBLICATIONS

Second Office Action from China Application No. 201510116854.0 dated Sep. 4, 2017.

\* cited by examiner

ARRAY SUBSTRATE AND METHOD FOR MANUFACTURING THE SAME, A DISPLAY PANEL AND METHOD FOR TESTING THE SAME, AND A DISPLAY APPARATUS

RELATED APPLICATIONS

The present application claims the benefit of Chinese Patent Application No. 201510116854.0, filed Mar. 17, 2015, the entire disclosure of which is incorporated herein by reference.

TECHNICAL FIELD

The present invention relates to the technical field of display, and in particular, to an array substrate and method for manufacturing the same, a display panel and method for testing the same, and a display apparatus.

BACKGROUND

In an existing COG (Chip On Glass) type of liquid crystal panels, the interval of lead wires at the connection between a drive chip bonded within a bond region of a glass substrate and the substrate is becoming increasingly small, e.g. about 15 μm. Accordingly, the interval of pins of a test group of pins is required to reach this level if an open test is performed to these lead wires in a conventional full contact mode. However, the interval of pins of the existing group of pins is at least about 30 μm, and the open test of lead wires can thus not be well implemented in the full contact mode. Furthermore, any test mode having a connection port contacted directly with a wiring terminal in the bond region generally has a high possibility of puncturing the lead wires, resulting in defects and a waste of materials.

Therefore the open test of lead wires of a COG liquid crystal panel is often performed in a shorting bar switching test mode in the prior art. That is, a display drive signal for the liquid crystal panel is provided by using a shorting bar circuit disposed at sides of the panel in order to carry out the test by observing light emitting; and at the mean time, the shorting bar circuit is switched between an active state and an inactive state in a switch controlled manner. However, for some reasons such as some of products being limited by the size of design space when designed, signal lines of the shorting bar circuit are not capable of passing through a region in which the above described lead wires are located and a fan-out region of the liquid crystal panel, so that the open of the wirings within these regions could not be detected in a shorting bar switching test mode if happens.

Accordingly, for the above described COG panel, the full contact mode would have a great amount of pin misses (i.e. some of the lead wires or wiring terminals within the bond region are not contacted with the pins) because the interval of pins is not small enough. Also, the lead wires would be punctured in the full contact mode, causing defects and a waste of materials. Furthermore, the open of lead wires occurred within some of the regions cannot be detected in the shorting bar switching test mode as described above, which fails to achieve a test effect. For the above reasons, a test for the open of lead wires of such a COG panel cannot be implemented in any existing conventional test modes.

SUMMARY

In order to overcome the problems in the prior art, the present invention provides an array substrate and method for manufacturing the same, a display panel and method for testing the same, and a display apparatus, enabling a lead wire open test for a display panel, for which a lead wire open test cannot be implemented in a traditional test mode.

According to a first aspect, the present invention provides an array substrate comprising a display region and at least one bond region located outside of the display region;

wherein a plurality of signal lines are disposed within the display region, and a plurality of wiring terminals connected to multiple ones of the plurality of signal lines through a plurality of first lead wires are disposed within each bond region;

The array substrate further comprises one or more test regions corresponding to arbitrary one or more of the at least one bond region;

wherein a plurality of test terminals are disposed within each test region, and the plurality of test terminals within any one of the one or more test regions are connected with the plurality of wiring terminals within a respective one of the at least one bond region through a plurality of second lead wires.

Optionally, the number and arrangement of the plurality of wiring terminals are identical to those of the plurality of test terminals, and the size and shape of each wiring terminal are identical to those of each test terminal.

Optionally, each test region is located at a side of a respective one of the at least one bond region away from the display region.

According to a second aspect, the present invention provides a method for manufacturing an array substrate, wherein the array substrate comprises a display region and at least one bond region, and any one of the at least one bond region is located at a side of the display region;

the method comprises:

forming a pattern comprising the at least one bond region and one or more test regions corresponding to any one or more of the at least one bond region;

wherein a plurality of signal lines are disposed within the display region, and a plurality of wiring terminals connected to multiple ones of the plurality of signal lines through a plurality of first lead wires are disposed within each bond region; and wherein a plurality of test terminals are disposed within each test region, and the plurality of test terminals within any one of the one or more test regions are connected with the plurality of wiring terminals within a respective one of the at least one bond region through a plurality of second lead wires.

Optionally, the number and arrangement of the plurality of wiring terminals are identical to those of the plurality of test terminals, and the size and shape of each wiring terminal are identical to those of each test terminal.

Optionally, each test region is located at a side of a respective one of the at least one bond region away from the display region.

According to a third aspect, the present invention also provides a display panel comprising any one of the above described array substrates.

According to a fourth aspect, the present invention also provides a method for testing anyone of the above described display panels, comprising:

for each test region, contacting a first test group of pins with the plurality of test terminals within the test region;

providing a bias voltage to the display panel, and providing a drive signal to the display panel through the first test group of pins; and observing display of the display panel to obtain a result of a lead wire open test.

Optionally, each pin of the first test group of pins has a predefined width in order to be contacted with two or more columns of test terminals.

Optionally, the method further comprises:

disconnecting the first test group of pins with the display panel; and providing a drive signal and a bias voltage to the display panel through a shorting bar circuit to obtain a display test result for the display panel.

According to a fifth aspect, the present invention also provides a display apparatus comprising anyone of the above described display panels.

As appreciated from the above aspects, according to the array substrates, the display panels and the display apparatuses provided by the present invention, pins may be contacted with the test terminals disposed within the test regions instead of the wiring terminals within the bond regions. Unlike the wiring terminals within the bond regions, the test terminals within the test regions may be configured freely in a certain range according to test requirements. Accordingly, the present invention implements, by making a structural improvement, a lead wire open test for a display panel for which the lead wire open test can not be implemented in an existing conventional mode.

In addition, the above described array substrates may be manufactured with the method for manufacturing an array substrate provided by the present invention, while the bond regions and test regions may be formed in one step by merely changing the pattern, so that the process is simplified and the cost is reduced.

Furthermore, with the testing method provided by the present invention, the lead wire open present in the fan-out regions and the bond regions may be detected effectively for a display panel for which a lead wire open test cannot be implemented in an existing conventional test mode, so that a better test effect is achieved.

As compared to the conventional full contact mode, the present invention may solve the problems of the excessively small interval of lead wires and of the possibility of puncturing the lead wires during the test; and as compared to the shorting bar switching test mode, the present invention may effectively detect the lead wire open present in the fan-out regions and the bond regions. Therefore according to the present invention, a lead wire open test may be well achieved and the defects and waste of materials caused by the test may be avoided.

Of course it is not necessary for any of products or methods of the present invention to have all the advantages as described above concurrently.

DESCRIPTION OF DRAWINGS

In order to more clearly illustrate technical solutions of embodiments of the present invention and the prior art, accompanying drawings required to describe the embodiments and the prior art will be introduced briefly in the following. Obviously, the drawings in the following are some of the embodiments of the present invention. From these drawings, other drawings may also be obtained by those of ordinary skills in the art without any inventive efforts.

DESCRIPTION OF EMBODIMENTS

In order to make the object, technical solutions and advantages of the embodiments of the present invention more clear, the technical solutions of the embodiments of the present invention will be described clearly and completely in connection with the drawings of the embodiments of the present invention below. Obviously, the described embodiments are some of the embodiments of the present invention, and not all. Based on the embodiments of the present invention, all other embodiments obtained by those of ordinary skills in the art without any inventive efforts will fall within the scope of the present invention.

Figure 1:
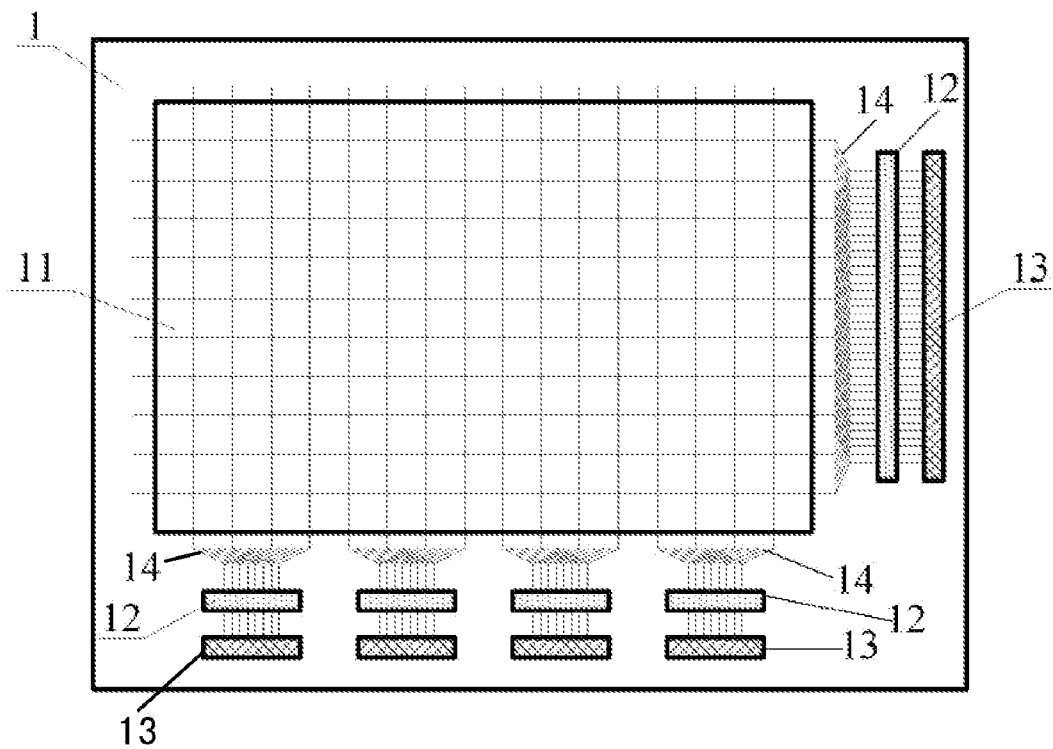
FIG. 1 is a schematic structural top view of an array substrate according to an embodiment of the present invention.

FIG. 1 is a schematic structural top view of an array substrate according to an embodiment of the present invention. With reference to FIG. 1, the array substrate 1 comprises a display region 11 and at least one bond region 12 (each bond region 12 is denoted by a rectangular block and only 5 bond regions are illustrated as an example in FIG. 1) located outside of the display region 11.

Among other things, a plurality of signal lines (denoted by interlaced lines within the display region 11 in FIG. 1) are disposed within the above described display region 11, and a plurality of wiring terminals (not shown in FIG. 1) connected to multiple ones of the plurality of signal lines through a plurality of first lead wires are disposed within each bond region 12. Among other things, the first lead wires are particularly denoted by lines connecting the above described signal lines with the bond regions 12 in FIG. 1. In one embodiment, there may be a one-to-one relationship between the first lead wires and the above described signal lines, and there may be a one-to-one relationship between the first lead wires and the wiring terminals.

Corresponding to one or more of the bond regions 12, the array substrate 1 further comprises one or more test regions 13 (each test region 13 is denoted by a rectangular block and only 5 test regions are illustrated as an example in FIG. 1). The test regions 13 are provided adjacent to the bond regions 12, being closer to the external edges of the array substrate than the bond regions 12. A plurality of test terminals (not shown in FIG. 1) are disposed within each test region 13, and the plurality of test terminals are connected with a plurality of wiring terminals within a respective bond region 12 through a plurality of second lead wires. Among other things, the second lead wires are particularly denoted by lines connecting the bond regions 12 with the test regions 13 in FIG. 1. In the embodiment illustrated by FIG. 1, there may be a one-to-one relationship between the second lead wires and the above described wiring terminals, and there may be a one-to-one relationship between the second lead wires and the test terminals. In other embodiments, there may be a different relationship between the second lead wires and the test terminals and between the second lead wires and the wiring terminals. Among other things, one bond region 12 may correspond to one or more test regions 13, and the test regions 13 and the bond regions 12 may render a one-to-one relationship as illustrated in FIG. 1. There is no limitation on the relationship between the bond regions 12 and the test regions 13 in the present invention.

For example, the display region 11 may be a region where an array of pixel circuits is located on the array substrate 1, and a bond region 12 may be a region where a drive chip is bonded on the array substrate 1. Signal lines are disposed within the display region 11 to transfer drive signals to the pixel circuits in the array substrate. After a drive chip is bonded within a bond region 12 of the array substrate 1, each of the lead feet of the drive chip is contacted with one wiring terminal described above to form an electrical connection therebetween, and drive signals may be output to the pixel circuits via the first lead wires and the signal lines within the display region 11.

Before a drive chip is bond, however, for the purpose of determining if current may flow between each wiring terminal and each pixel circuit (i.e. if there is an open circuit), it is desirable to apply a voltage to the wiring terminal to obtain a detect result through observing the operation of the pixel circuit (this process is shortly referred as "lead wire open test"). Currently, the most visualized method for applying a voltage is to apply a given voltage to each wiring terminal through a connecter such as a pin, i.e. in a full contact mode. However, the interval of lead wires at the connection between a chip and a substrate is becoming increasingly small, e.g. about 15 μm. Thus, the interval of pins of a test group of pins is required to reach this level if an open test is performed to these lead wires in a conventional full contact mode. However, the interval of pins of an existing test group of pins is at least about 30 μm, and the open test of lead wires could thus not be implemented in the full contact mode. Furthermore, testing with a connector contacted directly to a wiring terminal in a bond region generally has a high possibility of puncturing the lead wires, causing defects and a waste of materials.

To be noted, although the same voltage may be applied to each of the wiring terminals to implement the test such that a plurality of wiring terminals may be shorted together by e.g. a metal sheet contacted with all of the wiring terminals, it is desirable in practice to use pins contacted with the wiring terminals respectively instead of the metal sheet contacted with all the wiring terminals. The main reason is that with respect to a common manufacture process of an array substrate, wiring terminals within bond regions generally will not be located in one and the same plane in the thickness direction of the array substrate. For example, although there is no overlap between any two of the wiring terminals in the top view of the above described array substrate 1 as illustrated by FIG. 1, in fact arbitrary two of the wiring terminals may have different heights from each other in the thickness direction of the array substrate 1, such that if the metal sheet is placed directly on the bond regions 12, a situation in which the wiring terminals having a smaller height cannot be contacted with the metal sheet to transfer a voltage will be caused.

In order to avoid such a problem, in the existing shorting bar switching test mode, a display drive signal for a liquid crystal panel may be provided by using a shorting bar circuit disposed at sides of the panel in order to carry out the test by observing the light emitting; and at the mean time, the shorting bar circuit is switched between an active state and an inactive state in a switch controlled manner. However for some reasons such as some of the products being limited by the size of the design space when designed, the signal lines of the shorting bar circuit would be not capable of passing through the bond regions and the fan-out region (e.g. the inverted trapezoidal region 14 between the display region 11 and the bond regions 12 in FIG. 1) of the liquid crystal panel. In this case, the external voltage is transferred directly from the signal lines of the shorting bar circuit to each of the pixel circuits via the signal lines within the display region. However the signal lines of the shorting bar circuit do not pass through the wirings within the regions. If lead wire open occurs, it cannot be detected in the shorting bar switching test mode and thus the open test of lead wires cannot be achieved.

Contrast to the above two modes in which the open test of lead wires cannot be well implemented, the array substrate provided by the embodiments of the present invention can well implement the open test of lead wires. Particularly, since the above described test regions 13 are disposed on the array substrate 1, the voltage may be applied to the test terminals within the test regions 13 during the test, such that the voltage is indirectly applied to the wiring terminals within the bond regions 12 via the second lead wires in order to achieve the test. Unlike the bond regions 12 which are limited by a bond process, the test terminals within the test regions 13 may be configured within a certain range according to test requirements (e.g. the interval of the test terminals may be adjusted), such that the connectors such as pins may be contacted with the test terminals well in order to achieve the open test of lead wires.

After the test, drive chips may be bonded within the bond regions 12 in an existing process. The output of drive signals from the drive chips will not be affected because the test terminals within the test regions 13 are not electrically connected to any components other than the second lead wires after bonding. Furthermore, because what are contacted with the connecters during the open test of lead wires are the test terminals rather than the wiring terminals, it is possible to prevent the lead wires from being punctured by the pins during the test and thus avoid the defects caused by the puncture.

In view of this, the lead wire open test may be implemented well by making a structural improvement according to the embodiments of the present invention, for a display panel for which the lead wire open test can not be well implemented in an existing conventional test mode.

As compared to the conventional full contact mode, the embodiments of the present invention may solve the problems of the excessively small interval of lead wires and of the possibility of puncturing the lead wires during the test; and as compared to the shorting bar switching test mode, the present invention may effectively detect the lead wire open present in the bond regions and the fan-out regions. Therefore, according to the embodiments of the present invention, an open test of lead wires may be well achieved, and defects and a waste of materials caused by the test may be avoided.

To be noted, the number and locations of the bond regions 12 and the particular features of the first lead wires may be configured as desired as long as the requirement for the connection between the signal lines and the wiring terminals is fulfilled. The number and locations of the test regions 13, the size and shape of each test terminal and the number and arrangement of the test terminals within each test region as well as the particular features of the second lead wires may also be configured as desired as long as the requirement for the connection between the test terminals and the wiring terminals is fulfilled. In such configurations, it is apparent that the present invention may be practiced by persons skilled in the art according to the above without affecting the solving of the above technical problems. Accordingly, there is no limitation on these aspects in the present invention.

Specifically, each of the test regions 13 described above may be preferably located at a side of a respective bond region 12 away from the display region 11 as illustrated in FIG. 1, such that connecters may be contacted with the test terminals within the test regions 13 at edges of the panel without passing through or touching any other circuits, thus improving reliability of the test.

Figure 2:
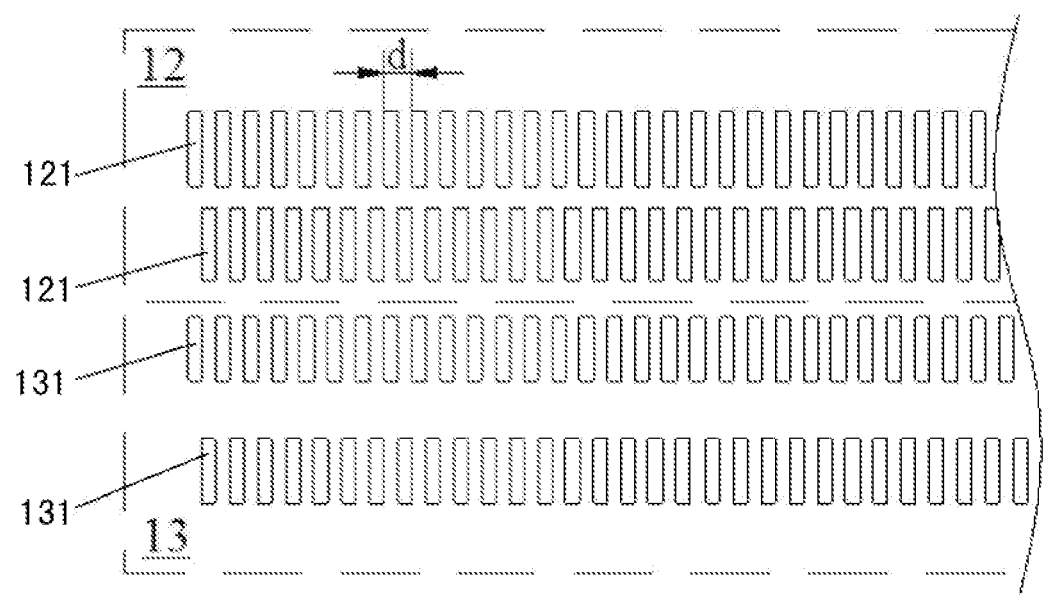
FIG. 2 is a schematic structural partial view of bond and test regions according to an embodiment of the present invention.

Further, FIG. 2 is a schematic structural partial view of the bond and test regions according to an embodiment of the present invention. With reference to FIG. 2, the wiring terminals 121, which are denoted by upright rectangular blocks, within a bond region 12 are arranged in two rows, and two wiring terminals 121 adjacent with each other in each row have an interval of d. Accordingly, the test terminals 131, which are also denoted by upright rectangular blocks, within a test region 13 are arranged in two rows. Particularly, within one bond region 12 and one test region 13 corresponding to each other e.g. as illustrated in FIG. 1, the number and arrangement of the wiring terminals 121 are identical with those of the test terminals 131, and the size and shape of each wiring terminal are identical to those of each test terminal. That is, according to an embodiment of the present invention, the test regions may be manufactured as a replication of the bond regions, being equivalent to regions obtained through moving the bond regions in parallel by a predefined distance. To be noted, wirings such as the first and second lead wires are not illustrated in FIG. 2. FIG. 2 mainly illustrates the configuration of the wiring and test terminals which are exposed to the outside and may be connected with the pins. Among other things, a second lead wire connecting a wiring terminal to a test terminal associated with the wiring terminal may be configured with reference to the lead wire configuration in the prior art, which will not be described in detail herein.

Based on the above, unlike the configuration of signal lines of the shorting bar circuit, the configuration of test regions occupies only a small part of the design space, and the test terminals within the test regions may be formed in the same manner as the wiring terminals within the bond regions (e.g. through changing the pattern of the conductor layer forming the wiring terminals), preventing the number of steps in the manufacture process from being increased.

Figure 3:
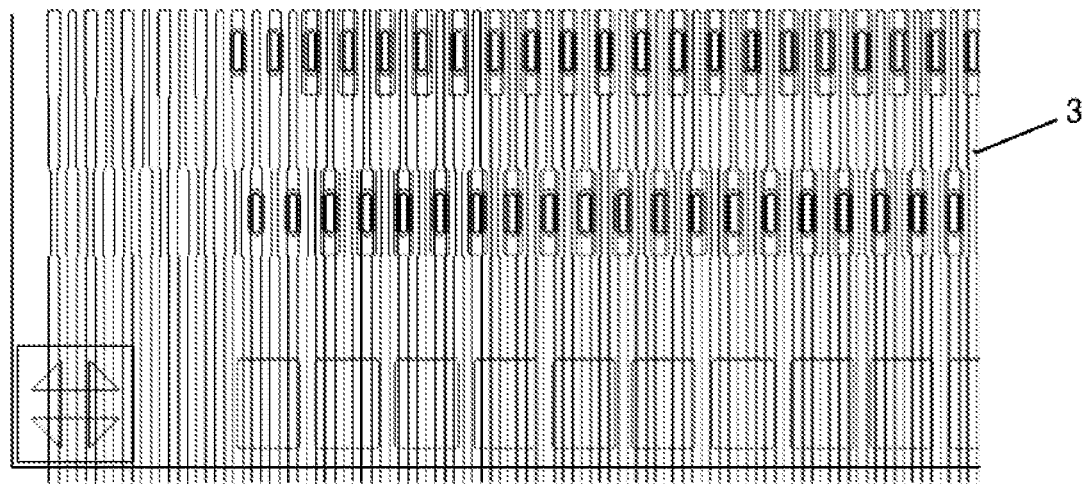
FIG. 3 is a schematic diagram illustrating contact of pins with wiring or test terminals in a full contact mode.

However, if the configuration of the test regions as illustrated in FIG. 2 is used, the problem that the test cannot be achieved due to the excessively small interval of lead wires in the full contact mode still exists, as shown in the schematic diagram of FIG. 3 illustrating the contact of the pins with the wiring or test terminals in the full contact mode. With reference to FIG. 3, when a group of pins (denoted by a set of stripes 3 extending vertically in FIG. 3) are contacted with the wiring or test terminals illustrated in FIG. 2, the interval of adjacent pins in the same row should be equivalent to d, while the interval of adjacent pins in different rows should be equivalent to d/2 (e.g. if d=15 μm, then the two intervals are about 15 μm and 7.5 μm respectively). This requires the pins to be sufficiently thin and long, the group of pins to be sufficiently dense, and the group of pins to be contacted with each wiring or test terminal exactly, which are difficult to achieve in the prior art. In a practical test, a large amount of pin misses (i.e. some of the lead wires or test terminals within the test regions are not contacted with the pins) will occur when such a group of pins are contacted with the wiring or test terminals; and since the pins are quite thin and acute, the lead wires on the panel is prone to be punctured by the pins to cause defects. Of course, although not shown in the structural top view illustrated by FIG. 2, it is possible for different test or wiring terminals to have different heights in the thickness direction of the array substrate as described above.

Figure 4:
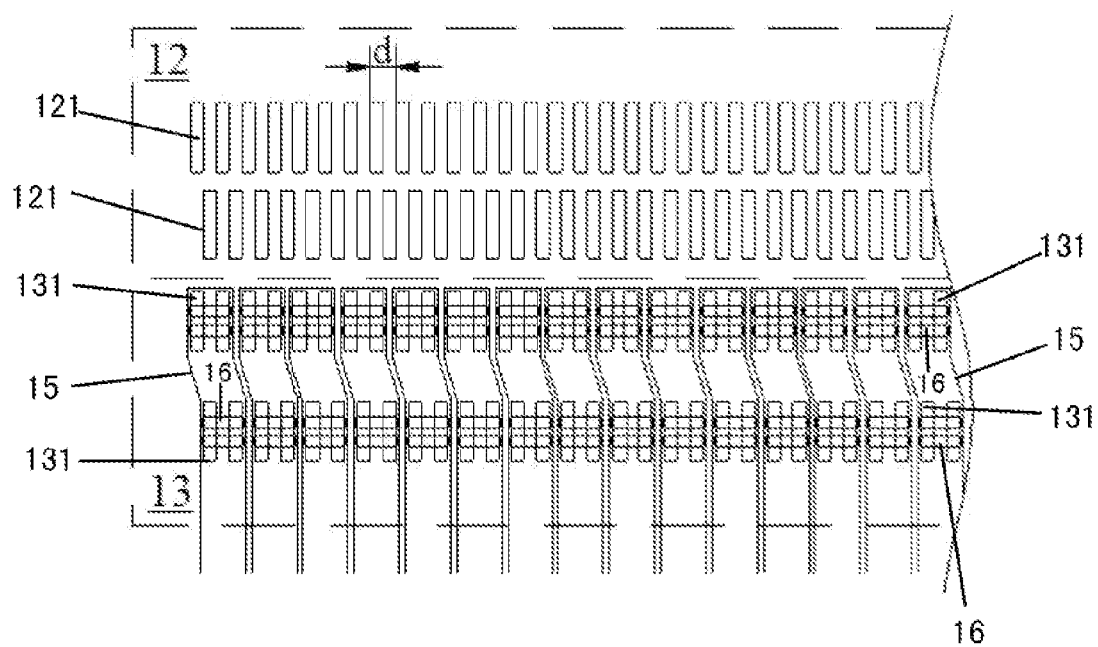
FIG. 4 is a schematic diagram illustrating a structure of a pin according to an embodiment of the present invention and contact of the pin with a test terminal.

In this regard, FIG. 4 shows a schematic diagram illustrating a structure 15 of a pin and the contact of the pin with the test terminal 131 within the test region 13 according to an embodiment of the present invention, in which only wiring terminals 121 are shown within the bond regions 12. With reference to FIG. 4, unlike the shape of an existing pin, the pin 15 of fold-line shape has a predefined width and is contacted with two columns of test terminals 131. Considering the difference in height between different test terminals, a tip of each pin may be deflected to some extent by a contact pressure to form an angular with respect to the plane of the array substrate, in order to contact well with the two columns of test terminals 131 to form electrical connections therebetween. In order to further enhance the reliability of the contacts and protect the pins, it is also possible to dispose conductor bridges 16 (denoted by short transverse lines across adjacent columns of test terminals 131 in FIG. 4) as illlustrated in FIG. 4 at a side of the pin facing the array substrate. That is, the conductor bridges 16 which may connect adjacent columns of test terminals or ajdacent columns of wring terminals may be disposed at a side of the pin facing the array substrate. Of course, in addition to forming the group of pins illusrated in FIG. 4 based on the pins according to the present invention with respect to the arrangement illustrated in FIG. 2, it is possible to adaptively change the size, shape, number, material, and arrangement of the pins in different application scenes. There is no limitation to such aspects in the present invention. In this way, the problem that the test cannot be achieved due to the excessively small interval of lead wires in the full contact mode may thus be overcome, the contact of the pins with the wiring terminals may be achieved in other application scenes in which the interval of lead wires is excessively small, and the pin misses as described above may be effectively reduced, enhancing the success rate of contacts. To be noted, although FIG. 4 only illustrates that each of the pins 15 may be contacted with two columns of test terminals, each of the pins may be configured to contact more columns of test terminals concurrently in other embodiments.

Based on the same concept as the above, embodiments of the present invention provide a method for manufacturing an array substrate, wherein the array substrate comprises a display region and at least one bond region, and any one of the bond regions is located at sides of the display region;

the method comprises:

forming a pattern comprising the at least one bond region and one or more test regions corresponding to any one or more of the bond regions;

wherein a plurality of signal lines are disposed within the display region, and a plurality of wiring terminals connected to multiple ones of the plurality of signal lines through a plurality of first lead wires are disposed within each bond region; and wherein a plurality of test terminals are disposed within each test region, and the plurality of test terminals within any one of the one or more test regions are connected with the plurality of wiring terminals within a respective one of the at least one bond region through a plurality of second lead wires.

In view of this, the method is applicable to the manufacture of any of the array substrates described above. With the method, the test terminals within the test regions are formed in the same manner as the wiring terminals within the bond regions, i.e. the test regions may be formed by using the pattern of the bond regions, preventing the number of the steps in the manufacture process from being increased. For the same reasons as the above, the size, number, shape and arrangement of the plurality of wiring terminals within the bond regions may be identical to those of the plurality of test terminals within the test regions, and the above described test regions may be located at a side of a respective bond region away from the display region. Accordingly, the manufacturing method may be applied to manufacture any of the array substrates as described above, which is not described in detail anymore herein.

Based on the same concept as the above, an embodiment of the present invention provides a display panel comprising any of the array substrates as described above. For example, the display panel may comprise the array substrate, a color film substrate opposed to the array substrate, and a liquid crystal layer located between the array substrate and the color film substrate. During manufacturing, the above described lead wire open test may be performed by means of applying a predefined voltage to the test regions on the array substrate.

Based on the same concept as the above, an embodiment of the present invention provides a display apparatus comprising any of the display panels as described above. In the present embodiment, the display apparatus may be a liquid crystal panel, a phone, a tablet computer, a TV, a notebook computer, a digital photo frame, a navigator, or any products or components having a display function. As the display apparatus according to the present invention comprises any of the display panels or array substrates as described above, the same technical problem as the above may be solved and the same techincal effect as the above may be achieved.

Figure 5:
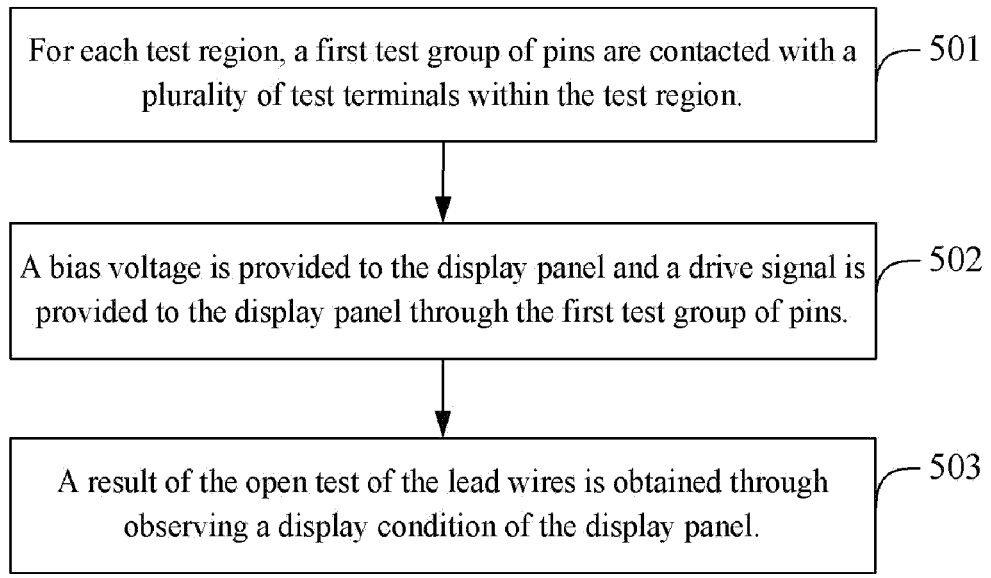
FIG. 5 is a schematic flow chart of a method for testing a display panel according to an embodiment of the present invention.

FIG. 5 is a schematic flow chart of a method for testing a display panel according to an embodiment of the present invention, wherein the display panel is any of the display panels as described above. With reference to FIG. 5, the method comprises:

at step 501: for each test region, a first test group of pins is contacted with the plurality of test terminals within the test region;

at step 502: a bias voltage is provided to the display panel and a drive signal is provided to the display panel through the first test group of pins; and at step 503: a result of the open test of lead wires is obtained through observing display of the display panel.

The first test group of pins refers to an electrical connecter for applying a predefined voltage to test terminals. There is no limitation on the form of the electrical connector. The bias voltage may comprise a common voltage V-COM of the display panel for example. The drive signal may comprise a data drive signal of the display panel or may also comprise a scan drive signal of the display panel, for example. The open test of lead wires refers to a test for detecting if an open circuit exists in wirings between the wiring terminals within the bond regions and the pixel circuits.

In view of this, according to the methods provided by the embodiments of the present invention, the above described open test of lead wires may be performed on the basis of the above described display panel, and the open of wirings within the fan-out regions and bond regions may be detected effectively. As compared to the conventional full contact mode, the embodiments of the present invention may solve the problems of the excessively small interval of lead wires and of the possibility of puncturing the lead wires during the test; and as compared to the shorting bar switching test mode, the present invention may effectively detect the lead wire open present in the fan-out regions and the bond regions. Therefore according to the present invention, an open test of lead wires may be well achieved and the defects and waste of materials caused by the test may be avoided.

In addition, for the same reasons as the above, each pin of the first test group of pins may have a predefined width in order to be contacted with two columns of test terminals. That is, the structure obtained after concating in step 501 may be as illustrated in FIG. 4. In this way, the problem that the test cannot be achieved due to the excessively small interval of lead wires in the full contact mode may thus be overcome, the contact of the pins with the wiring terminals may be achieved in other application scenes in which the interval of lead wires is excessively small, and the pin misses as described above may be effectively reduced, enhancing the success rate of the contact.

Optionally, a test other than the open test of lead wires described above may be performed in the shorting bar switching test mode, i.e. the above method for testing may also comprise the following steps not shown in the figures:

at step 504: disconnecting the first test pin group from the display panel;at step 505: a drive signal and a bias voltage are provided to the display panel through a shorting bar circuit to obtain a display test result for the display panel.

Of course, with respec to the embodiment including steps 504 and 505, the array substrate is required to be pre-equiped with a respective shorting bar circuit. In this case, the common voltage V-COM may be provided to the display panel particulraly via the shorting bar circuit in step 502, and a test other than the open test of lead wires described above may be performed by the shorting bar circuit after the first test group of pins are disconnected with the display panel. Based on this method, the embodiments of the present invention overcome a defect that the lead wire open cannot be detected by merely performing the shorting bar switching test, without increasing the production cycle time and causing productivity loss.

In order to more clearly illustrate optional technical solutions of the present invention, a structure of an array substrate and a flow chart of a method for testing a display panel comprising the array substrate are particuarly provided in the follwing.

Figure 6:
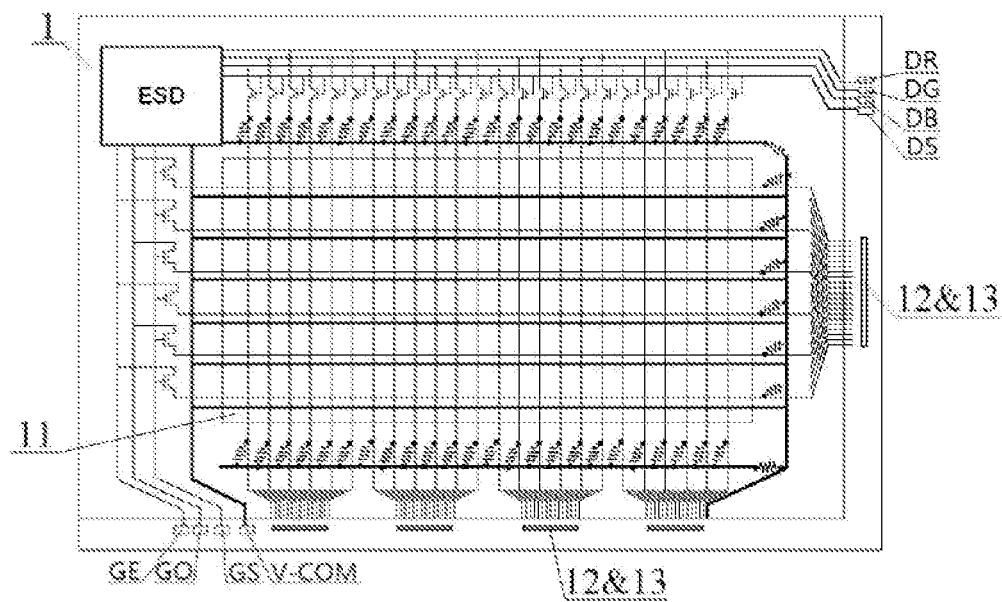
FIG. 6 is a schematic structural top view of a COG panel according to an embodiment of the present invention.

FIG. 6 is a schematic structural top view of an array panel according to an embodiment of the present invention. With reference to FIG. 6, similar to the structure illustrated in FIG. 1, the array panel 1 comprises a display region 11, bond regions 12 and test regions 13. Each bond region 12 is located outside of the display region 11, and each test region 13 is located at a side of a respective bond region 12 away from the display region 11 (not shown in FIG. 6, only an area where the bond regions 12 and test regions 13 are located is shown by "12&13").

A plurality of signal lines are disposed within the display region 11. Although not shown in FIG. 6, a plurality of wiring terminals connected to multiple ones of the plurality of signal lines through a plurality of first lead wires are disposed within each bond region 12 and a plurality of test terminals connected with the plurality of wiring terminals within a respective bond region 12 through a plurality of second lead wires are disposed within each test region 13. Not all of the first and second lead wires are shown in FIG. 6, and the plurality of wiring terminals within the bond regions 12 and the plurality of test terminals within the test regions 13 may be for example configured with reference to FIG. 2.

Furthermore, a shorting bar circuit is also disposed around the display region 11 on the array substrate 1. Corresponding to a plurality rows of scan lines within the display region 11, the shorting bar circuit is provided with a first scan port GE, a second scan port GO, a third scan port GS. Corresponding to a plurality columns of data lines within the display region 11, the shorting bar circuit is provided with a first data port DR, a second data port DG, a third data port DB and a forth data port DS.

For each row of pixel elements, the shorting bar circuit comprises a transistor having a gate connected to the GS, a source and a drain. One of the source and drain is connected to a signal line of the current row of pixel elements, and the other is connected to the GO if the current row of pixel elements is an odd row of pixel elements and connected to the GE if the current row of pixel elements is an even row of pixel elements.

For each column of pixel elements, the shorting bar circuit comprises a transistor having a gate connected to the DS, a source and a drain. One of the source and drain is connected to a signal line of the current column of pixel elements, and the other is connected to one of the DR, DG, and DB in turn depending on the columns of pixel elements (e.g. one of the source and drain of the transistor corresponding to the first column of pixel elements is connected to DR, one of the source and drain of the transistor corresponding to the second column of pixel elements is connected to DG, one of the source and drain of the transistor corresponding to the third column of pixel elements is connected to DB, one of the source and drain of the transistor corresponding to the fourth column of pixel elements is connected to DR, one of the source and drain of the transistor corresponding to the fifth column of pixel elements is connected to DG, and one of the source and drain of the transistor corresponding to the sixth column of pixel elements is connected to DB, and so forth).

Accordingly, under the control of switch signals at GS or DS, the transistor may transfer the signal at GO/GE/DR/DG/DB to a respective row or column of the signal lines. Thus, a drive voltage may be provided to the pixel circuits within the display region 11 by the shorting bar circuit instead of the drive chip, in order to be used in the test.

Furthermore, an electrostatic discharge circuit may also be disposed on the array substrate 1. The electrostatic discharge circuit comprises a electrostatic prevention (ESD) module connected to a common voltage port V-COM directly or indirectly, a plurality of electrostatic prevention lead wires and a plurality of electrostatic prevention elements. The electrostatic prevention lead wires are connected to all of signal lines in the display region 11 through the electrostatic prevention elements. The electrostatic prevention (ESD) module is also connected to the ports such as GO/GE/GS/DR/DG/DB/DS through a pluratliy of wirings.

In view of this, the shorting bar circuit in the array substrate 1 does not pass through the fan-out region 14 and the bond regions 12, so that it is impossible to detect the open of wirings within these regions by testing with only the shorting bar circuit. For a display panel comprising the arrary substrate 1, the test may be performed in a two-step lighting mode.

Figure 7:
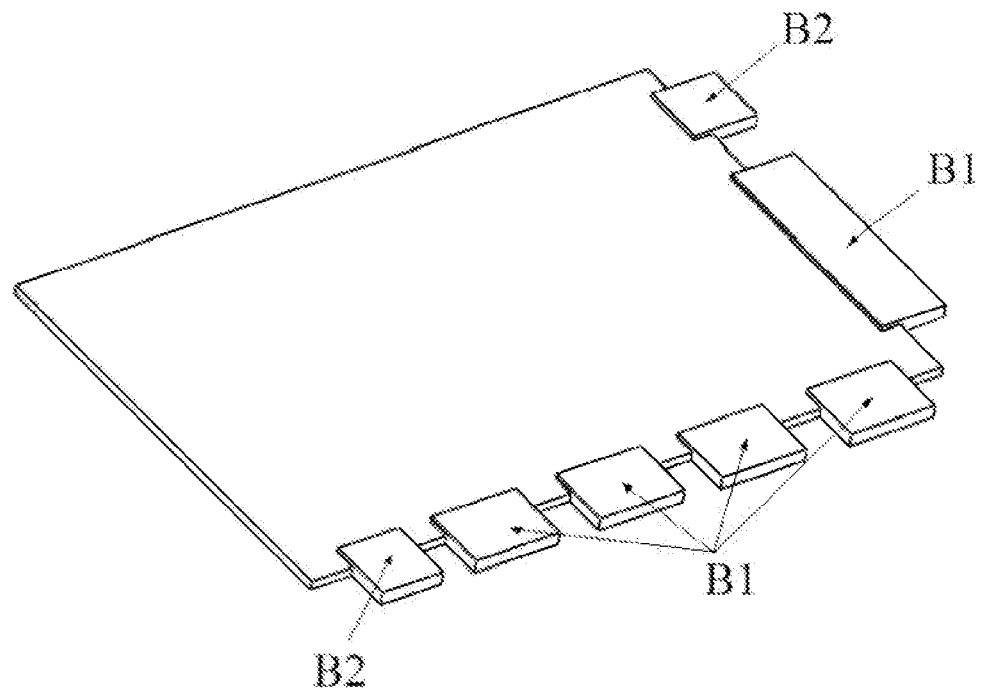
FIG. 7 is a schematic diagram illustrating a first light up test step of a method for testing a display panel according to an embodiment of the present invention.

FIG. 7 is a schematic diagram illustrating a first light up test step of a method for testing a display panel according to an embodiment of the present invention. With reference to FIG. 7, in the first light up test step, a first test group of pins B1 is contacted with test terminals within a respective test region, wherein the specific structure at the contact location is as shown in FIG. 4; one group of two second test groups of pins B2 is connected to the port GO/GE/GS/V-COM and the other one is connected to the port DR/DG/DB/DS. Particularly, during the test, a common voltage V-COM may be provided to the display panel through the second test groups of pins B2, while a drive signal may be provided to the display panel through the first test groups of pins B1. The drive signal may thus be transferred to each of the pixel circuits in an order of "test terminal—second lead wire-wiring terminal—first lead wire-signal line—pixel circuit". Normally, the entire display panel will render a full surface light state or a full surface dark state. If a lead wire open occurs, one or more dark lines or light lines will be rendered on the display panel in the rows or columns of lead wires where such a lead wire open occurs. In view of this, with the above described array substrate, the first test groups of pins B1 and associated test methods, a lead wire open test which cannot be implemented in the existing conventional test mode may be implemented and a good test effect may be achieved.

Figure 8:
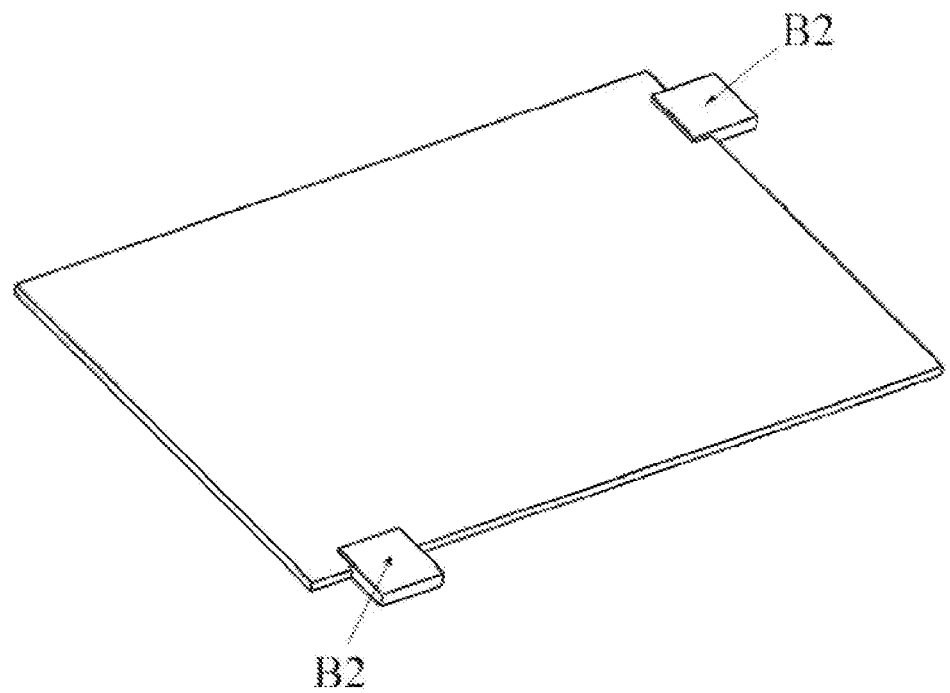
FIG. 8 is a schematic diagram illustrating a second light up test step of a method for testing a display panel according to an embodiment of the present invention.

FIG. 8 is a schematic diagram illustrating a second light up test step of a method for testing a display panel according to an embodiment of the present invention. At this point, particularly, the first test groups of pins B1 are disconnected with the display panel, and a common voltage V-COM and a drive signal are provided to the display panel through the second test groups of pins B2, such that all of the display tests other than the lead wire open test may be done.

It is to be noted in the description of the present invention, the terms such as "above" and "below" indicate an orientation or position relationship based on the orientation or position relationship as shown in the accompanying drawings, only for the purpose of facilitating and simplifying the description of the present invention, not to indicate or imply that the referred apparatuses or elements should be located at a specific location or constructed or operated in a specific orientation, and thus such terms cannot be interpreted as a limitation of the present invention. Unless otherwise specified and defined explicitly, the terms "mount", "connect with" and "connect" should be interpreted in a broad sense, for example as a fixed connection, a removable connection, or an integral connection; as a mechanical connection or an electrical connection; as a direct connection, an indirect connection via an intermediate media, or an internal connection between two elements. The meanings of the above terms in the present invention may be understood by persons having ordinary skills in the art depending on the circumstances.

It is also to be noted that, the relationship terms such as "first" and "second" are herein intended only to distinguish entities or operations from each other, not requiring or implying that such entities or operations are actually configured in such relationship or order. Moreover, the terms "comprise", "include" and any other variation thereof are intended to be inclusive not exclusively, such that a process, method, article or device comprising a series of elements may also comprise other elements which are not listed explicitly or comprised inherently in the process, method, article or device. Unless otherwise specifically limited, the phrase "comprising a . . . " before an element does not exclude presence of other same elements in the process, method, article or device comprising the element.

The forgoing embodiments are only intended to illustrate and not limit the technical solutions of the present invention. Although the present invention is illustrated in detail with reference to the forgoing embodiments, it should be appreciated by ordinary persons skilled in the art that modifications to these technical solutions recited in the forgoing embodiments or equivalent replacement of some of the technical features in these embodiments can be made without departing from the spirit and scope of the present invention in nature.

The invention claimed is:

1. An array substrate, comprising a display region and at least one bond region located outside of the display region;
   wherein a plurality of signal lines are disposed within the display region, and a plurality of wiring terminals connected to multiple ones of the plurality of signal lines through a plurality of first lead wires are disposed within each bond region;
   the array substrate further comprises one or more test regions corresponding to arbitrary one or more of the at least one bond region;
   wherein a plurality of test terminals are disposed within each test region, and the plurality of test terminals within any one of the one or more test regions are connected with the plurality of wiring terminals within a respective one of the at least one bond region through a plurality of second lead wires,
   wherein intervals of the plurality of test terminals are larger than or equal to intervals of the plurality of wiring terminals.

2. The array substrate of claim 1, characterized in that the number and arrangement of the plurality of wiring terminals are identical to those of the plurality of test terminals, and the size and shape of each wiring terminal are identical to those of each test terminal.

3. The array substrate of claim 1, characterized in that each test region is located at a side of a respective one of the at least one bond region away from the display region.

4. A method for manufacturing an array substrate, characterized in that, the array substrate comprises a display region and at least one bond region, and any one of the at least one bond region is located at a side of the display region;
   the method comprises forming a pattern comprising the at least one bond region and one or more test regions corresponding to any one or more of the at least one bond region;
   wherein a plurality of signal lines are disposed within the display region, and a plurality of wiring terminals connected to multiple ones of the plurality of signal lines through a plurality of first lead wires are disposed within each bond region; and
   wherein a plurality of test terminals are disposed within each test region, and the plurality of test terminals within any one of the one or more test regions are connected with the plurality of wiring terminals within a respective one of the at least one bond region through a plurality of second lead wires;
   wherein intervals of the plurality of test terminals are larger than or equal to intervals of the plurality of wiring terminals.

5. The method of claim 4, characterized in that the number and arrangement of the plurality of wiring terminals are identical to those of the plurality of test terminals, and the size and shape of each wiring terminal are identical to those of each test terminal.

6. The method of claim 4, characterized in that each test region is located at a side of a respective one of the at least one bond region away from the display region.

7. A display panel comprising the array substrate of claims 1.

8. A testing method for the display panel including an array substrate, characterized in that, the array substrate comprises a display region and at least one bond region located outside of the display region; wherein a plurality of signal lines are disposed within the display region, and a plurality of wiring terminals connected to multiple ones of the plurality of signal lines through a plurality of first lead wires are disposed within each bond region; the array substrate further comprises one or more test regions corresponding to arbitrary one or more of the at least one bond region; wherein a plurality of test terminals are disposed within each test region, and the plurality of test terminals within any one of the one or more test regions are connected with the plurality of wiring terminals within a respective one of the at least one bond region through a plurality of second lead wires, wherein intervals of the plurality of test terminals are larger than or equal to intervals of the plurality of wiring terminals,
   the method comprises:
   for each test region, contacting a first test group of pins with the plurality of test terminals within the test region;
   providing a bias voltage to the display panel and providing a drive signal to the display panel through the first test group of pins; and
   observing display of the display panel to obtain a result of a lead wire open test.

9. The method of claim 8, characterized in that each pin of the first test group of pins has a predefined width in order to be contacted with two or more columns of test terminals.

10. The method of claim 8, further comprising:
    disconnecting the first test group of pins with the display panel; and
    providing a drive signal and a bias voltage to the display panel through a shorting bar circuit to obtain a display test result for the display panel.

11. A display apparatus, comprising the display panel of claim 7.

* * * * *